(12) United States Patent
Chang et al.

(10) Patent No.: US 9,235,677 B1
(45) Date of Patent: Jan. 12, 2016

(54) THERMAL UNIFORMITY COMPENSATING METHOD AND APPARATUS

(71) Applicant: United Microelectronics Corp., Hsinchu (TW)

(72) Inventors: Chun-Ming Chang, Kaohsiung (TW); Wen-Jung Liao, Hsinchu (TW); Chen-Wei Lee, Hsinchu (TW); Chun-Liang Hou, Hsinchu County (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 14/333,919

(22) Filed: Jul. 17, 2014

(51) Int. Cl.
*G06F 17/50* (2006.01)

(52) U.S. Cl.
CPC .................. *G06F 17/5081* (2013.01)

(58) Field of Classification Search
CPC ............ G06F 17/5068; G06F 2217/80; G06F 17/5036; G06F 2217/12; G06F 17/5009; G06F 17/5018; G06F 17/5022; G06F 17/5081; G06F 1/206; G06F 2217/78; G06F 2217/84
See application file for complete search history.

(56) References Cited

U.S. PATENT DOCUMENTS

| | | | |
|---|---|---|---|
| 5,640,329 A * | 6/1997 | Matsunaga et al. | 716/111 |
| 7,028,277 B2 | 4/2006 | Chang et al. | |
| 8,103,983 B2 | 1/2012 | Agarwal et al. | |
| 8,219,951 B2 | 7/2012 | Cheng et al. | |
| 2006/0031794 A1 * | 2/2006 | Li et al. | 716/4 |
| 2009/0296055 A1 | 12/2009 | Ye et al. | |
| 2011/0122914 A1 * | 5/2011 | Wang et al. | 374/43 |
| 2011/0214101 A1 * | 9/2011 | Cheng et al. | 716/136 |
| 2012/0144361 A1 * | 6/2012 | Cheng et al. | 716/132 |
| 2013/0061196 A1 * | 3/2013 | Cheng et al. | 716/132 |

* cited by examiner

*Primary Examiner* — Nha Nguyen
(74) *Attorney, Agent, or Firm* — J.C. Patents

(57) ABSTRACT

The invention provides a thermal uniformity compensating method and apparatus. The steps of the method includes: respectively measuring a plurality of first resistances of a plurality of hot spot patterns of a chip over an hot spot effect, wherein a plurality of pattern densities of the hot spot patterns are different; respectively measuring a plurality of second resistances of each of the hot spot patterns of the chip by a plurality of test keys over the hot spot effect, wherein a plurality of distances between the test keys and the corresponding hot spot pattern are different; establishing a look-up information according to the first and second resistances; analyzing a layout data of the chip for obtaining a pattern density information; and generating a calibrated layout data according to the pattern density information and the look-up information.

16 Claims, 7 Drawing Sheets

THERMAL UNIFORMITY COMPENSATING METHOD AND APPARATUS

BACKGROUND

1. Field of the Invention

The invention relates to a thermal uniformity compensating apparatus and method. Particularly, the invention relates to a thermal uniformity compensating method for hot spot effect in semiconductor process.

2. Description of Related Art

In conventional, a standard test key with 20-pads is used for detecting the thermal uniformity by resistance change. Many hot-spot-patterns with many types respectively are disposed in the wafer for the detection. For example, different sizes and densities of the hot-spot-patterns are used for the detection. Moreover, for reducing the hot spot effect, a LRTP injection direction and/or a laser scan skilled can be changed. That is, in conventional, the hot spot effect can be only measured and difficult to be predicted before the wafer being taped out again. At the stage of the hot spot detection, the hot spot effect could not be fully compensated.

SUMMARY OF THE INVENTION

The invention is directed to a thermal uniformity compensating method and apparatus, which can compensate the thermal uniformity of a chip before tape-out.

The invention provides a thermal uniformity compensating method for a chip, the steps of the method includes: respectively measuring a plurality of first resistances of a plurality of hot spot patterns of the chip over an hot spot effect, wherein a plurality of pattern densities of the hot spot patterns are different; respectively measuring a plurality of second resistances of each of the hot spot patterns of the chip by a plurality of test keys over the hot spot effect, wherein a plurality of distances between the test keys and the corresponding hot spot pattern are different; establishing a look-up information according to the first and second resistances; analyzing a layout data of the chip for obtaining a pattern density information; and generating a calibrated layout data according to the pattern density information and the look-up information.

The invention also provides a thermal uniformity compensating apparatus, and the thermal uniformity compensating apparatus includes a controller and a storage unit. The controller is configure for: respectively measuring a plurality of first resistances of a plurality of hot spot patterns of a chip over an hot spot effect; respectively measuring a plurality of second resistances of each of the hot spot patterns of the chip by a plurality of test keys over the hot spot effect, wherein a plurality of pattern densities of the hot spot patterns are different, and a plurality of distances between the test keys and the corresponding hot spot pattern are different; establishing a look-up information according to the first and second resistances; and generating a calibrated layout data according to the pattern density information and the look-up information. The storage unit is coupled to the controller, and the storage unit is used for storing the look-up information.

According to the above descriptions, in the invention, the variations of resistance can be obtained with thermal difference, and a look-up information can be obtained by the variations of resistance. By referring to the look-up information, the hot spot impact can be predicted, and the thermal uniformity can be compensated before the chip is taped-out. Such as that the critical dimension (CD) value can be well controlled by optical proximity correction (OPC) selective sizing skill, and no complicated procedure is needed for carrying out the thermal uniformity compensating method.

In order to make the aforementioned and other features and advantages of the invention comprehensible, several exemplary embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DETAILED DESCRIPTION OF DISCLOSED EMBODIMENTS

Figure 1:
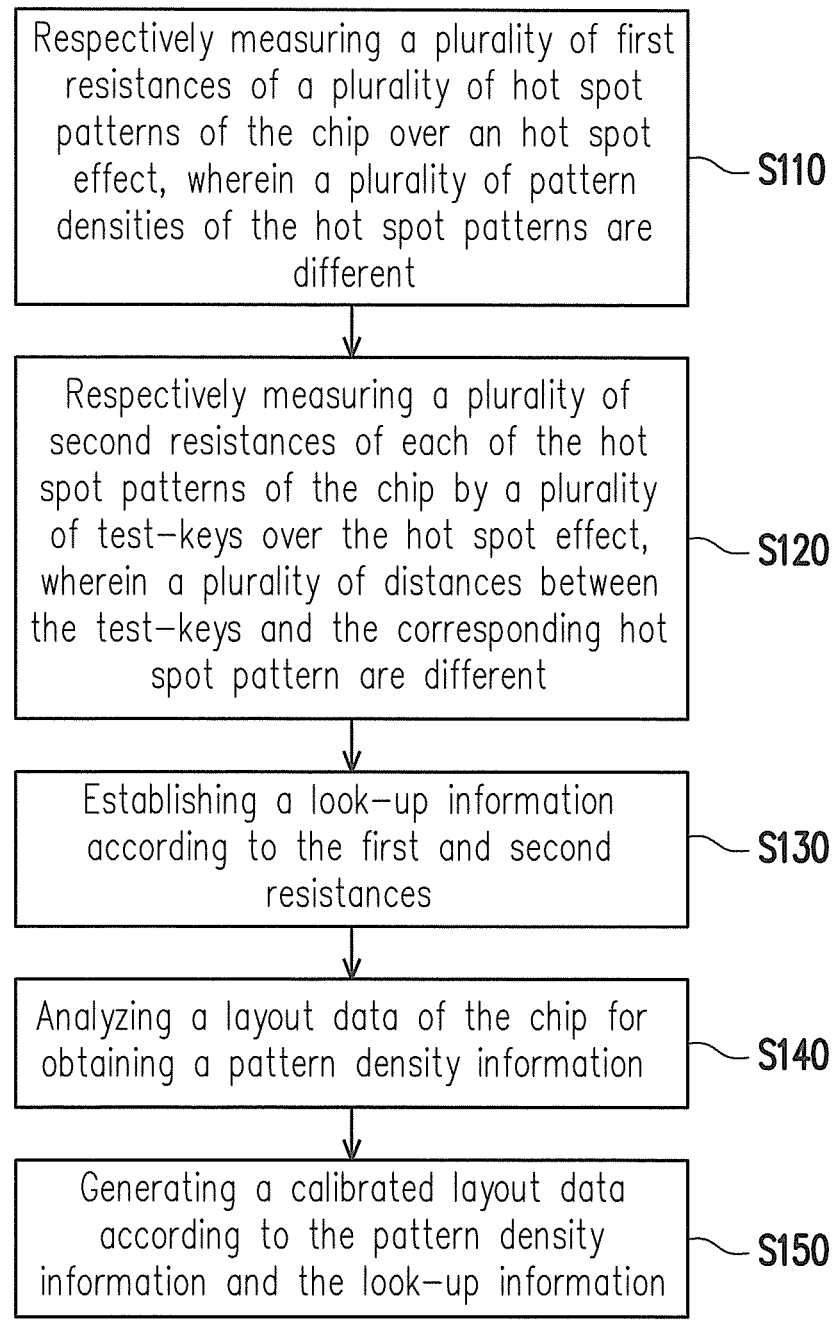
FIG. 1 is a flow chart of a thermal uniformity compensating method according to an embodiment of the invention.
Figure 2:
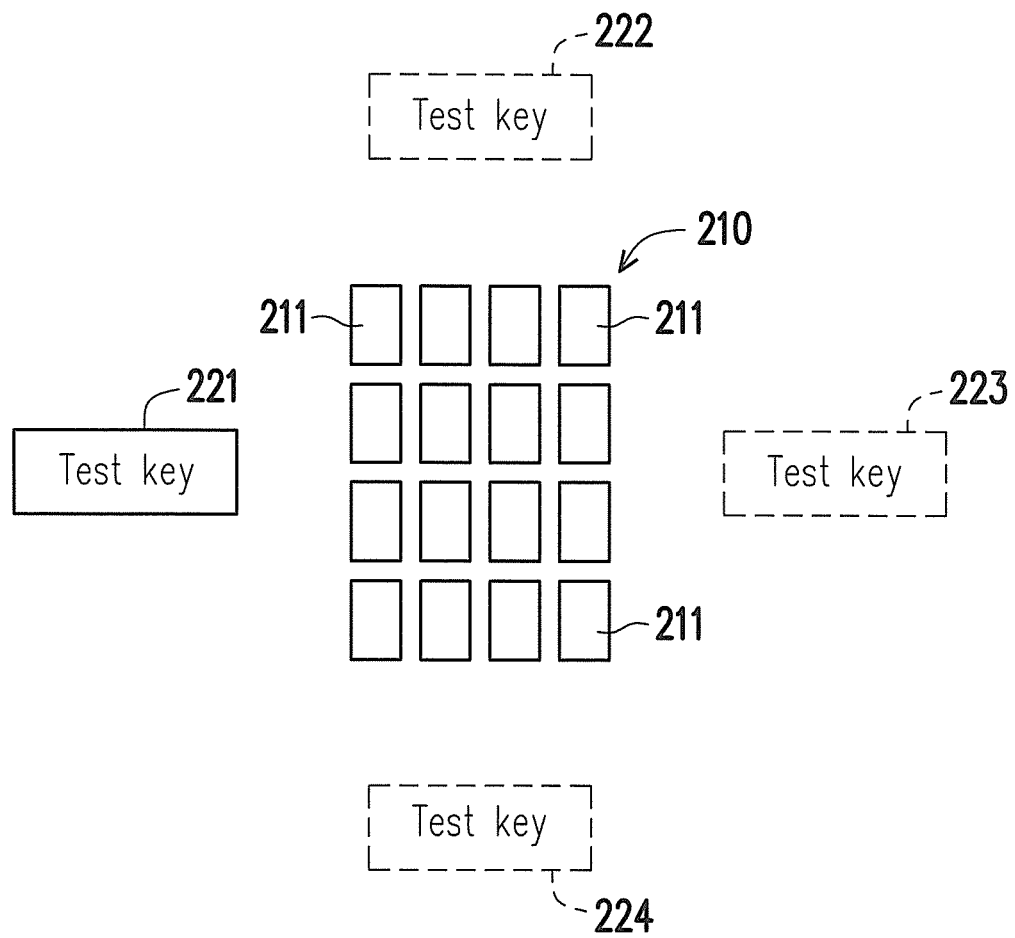
FIG. 2 illustrates a hot spot pattern according to the embodiment of the invention.

Referring to FIG. 1, FIG. 1 is a flow chart of a thermal uniformity compensating method according to an embodiment of the invention. The thermal uniformity compensating method may be applied on a chip. In this embodiment, a plurality of hot spot patterns are disposed in the chip, and there are a plurality of test keys are disposed around each of the hot spot patterns. Referring to the FIG. 2, FIG. 2 illustrates a hot spot pattern according to the embodiment of the invention. In FIG. 2, the hot spot pattern 210 is formed by a plurality of resistance providing units 211. The resistance providing units 211 are arranged in an array. Furthermore, one or more test keys 221-224 are disposed around the hot spot pattern 210. The test keys 221-224 may be coupled to the hot spot pattern 210, and the resistance of the hot spot pattern 210 may be measured through the test keys 221-224.

Additionally, each of the resistance providing units 211 may be any material in the chip of a semiconductor wafer. In the embodiment, each of the resistance providing units 211 may be a poly block or a diffusion block.

Referring to FIG. 1 again, in step S110, a plurality of first resistances of the hot spot patterns respectively of the chip are measured over a hot spot effect. Especially, the hot spot patterns respectively have a plurality of pattern densities, and the pattern densities are different.

Figure 3A:
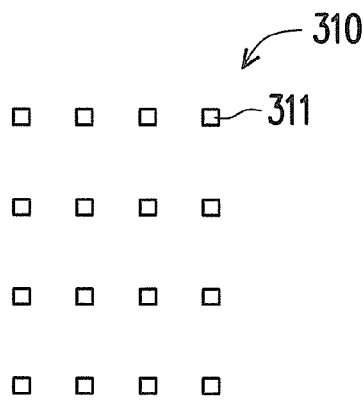
FIGS. 3A-3C respectively illustrate a plurality of hot spot patterns which have different pattern densities.
Figure 3B:
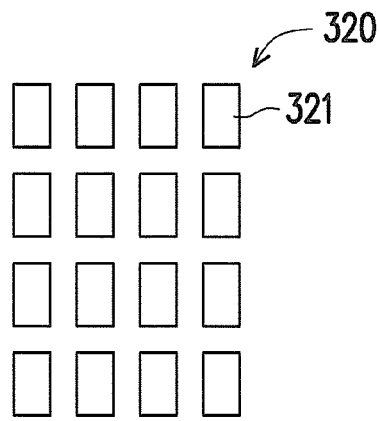
Figure 3C:
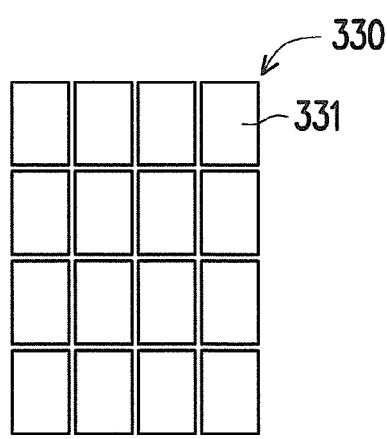

Referring to FIGS. 3A-3C, FIGS. 3A-3C respectively illustrate a plurality of hot spot patterns which have different pattern densities. In FIGS. 3A-3C, the hot spot pattern 310 is formed by a plurality of resistance providing units 311, the hot spot pattern 320 is formed by a plurality of resistance providing units 321, and the hot spot pattern 330 is formed by a plurality of resistance providing units 331. An area of the resistance providing unit 311 is smallest of areas of the resistance providing units 311, 321 and 331, and the area of the resistance providing unit 331 is largest of areas of the resistance providing units 311, 321 and 331. That is, a distance between two neighbored resistance providing units 311 is larger than a distance between two neighbored resistance providing units 321, and the distance between two neighbored resistance providing units 321 is larger than a distance between two neighbored resistance providing units 331. It can be realized easily by FIGS. 3A-3C, the density of the hot spot pattern 330 is larger than the density of the hot spot pattern 320, and the density of the hot spot pattern 320 is larger than the density of the hot spot pattern 310.

Please be noted here, the resistances of the hot spot patterns 310-330 may be measured by the test keys which are respectively corresponding to the hot spot patterns 310-330. A distance between the hot spot pattern 310 and corresponding test key equals to a distance between the hot spot pattern 320 and corresponding test key, and a distance between the hot spot pattern 320 and corresponding test key equals to a distance between the hot spot pattern 330 and corresponding test key.

Figure 4:
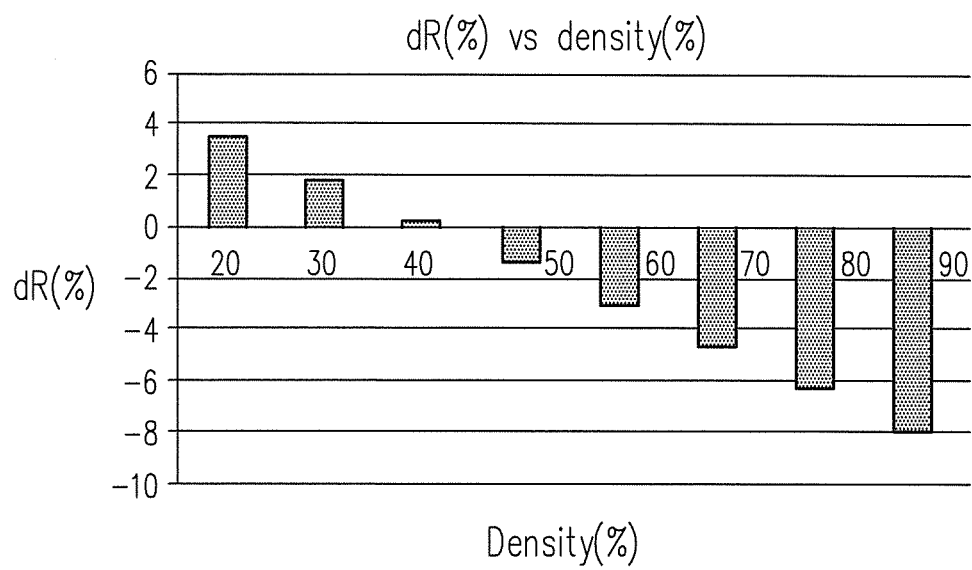
FIG. 4 illustrates a bar chart which is established according to resistance variations dR and densities of the hot spot patterns.

By measuring the resistances of a plurality of hot spot patterns respectively, a relationship between resistance and density of hot spot pattern may be obtained. Referring to FIG. 4, FIG. 4 illustrates a bar chart which is established according to resistance variations dR and densities of the hot spot patterns. In FIG. 4, the resistance variation dR is decreased when the density of the hot spot pattern is increasing. That is, high density causes the hot spot pattern to tend to lower resistance, and low density causes the hot spot pattern to tend to higher resistance.

Figure 5:
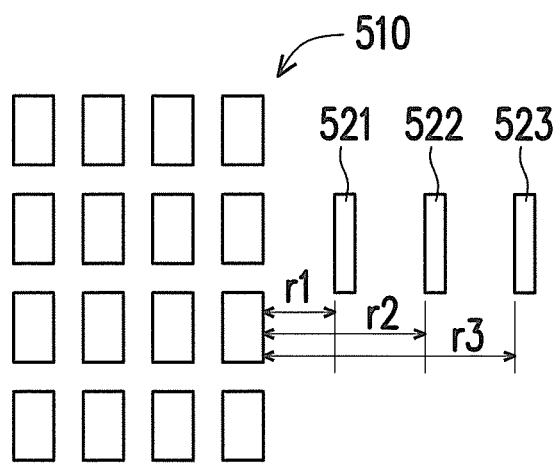
FIG. 5 illustrates a block diagram for measuring the second resistances of the hot spot pattern according to the embodiment of present application.

Referring to FIG. 1 again, in step S120, a plurality of second resistances of each of the hot spot patterns are measured, and the second resistances is measure by the test keys which are disposed around the corresponding hot spot pattern. In detail, the second resistances are measured through a plurality of test keys, and distances between the test keys and the corresponding hot spot pattern are different. Please referring to FIG. 5, FIG. 5 illustrates a block diagram for measuring the second resistances of the hot spot pattern according to the embodiment of present application. In FIG. 5, a plurality of test keys 521-523 are disposed beside to the hot spot pattern 510. The distance r1 between the test key 521 and the hot spot pattern 510 is smaller than the distance r2 between the test key 522 and the hot spot pattern 510. The distance r2 between the test key 522 and the hot spot pattern 510 is smaller than the distance r3 between the test key 523 and the hot spot pattern 510.

Figure 6:
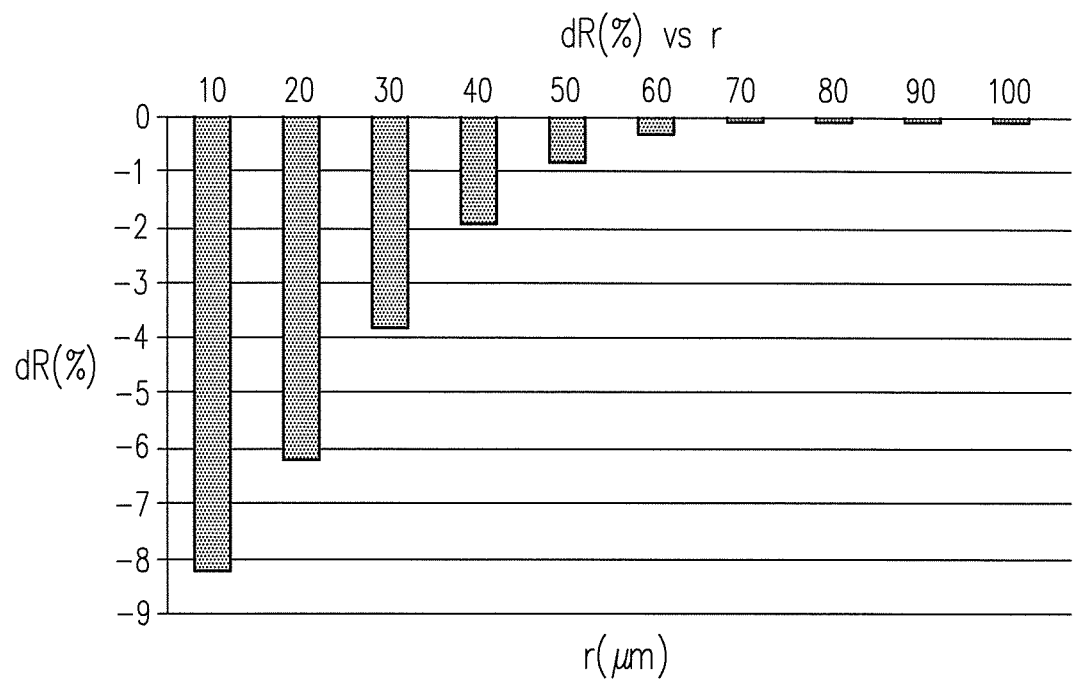
FIG. 6 illustrates a bar chart which is established according to resistance variations dR of the hot spot pattern and the distances between the hot spot pattern and corresponding test keys.

By measuring the second resistances of the hot spot pattern 510 through the test keys 521-523 respectively, a relationship between resistances of hot spot pattern and distance between the hot spot pattern and test keys may be obtained. Referring to FIG. 6, FIG. 6 illustrates a bar chart which is established according to resistance variations dR of the hot spot pattern and the distances between the hot spot pattern and corresponding test keys. In FIG. 6, the resistance of the hot spot pattern is increasing while the distance between the hot spot pattern and test key is increasing. That is, the resistance of the hot spot pattern is decreasing while the distance between the hot spot pattern and test key is decreasing.

Referring to FIG. 1 again, by integrating the measuring result of the first resistances and the second resistances, a look-up table may be established accordingly. In an embodiment of present application, the resistance variation dR can be presented by formula 1 according to the density of the hot spot pattern and the distance r. The formula 1 is shown as below:

$$dR \% = (a \times \text{Density} + b) \times e^{(-r^2/c)}$$

Wherein, a, b, and c are constant parameters and may be determined by measuring results shown as the bar charts of FIG. 4 and FIG. 6.

The formula 1 may be used to generate the look-up information when the constant parameters a, b, c are determined. Also, a look-up table can be established by digitalizing the formula 1, and the look-up table may be used to provide the look-up information. Further, the look-up table may be implemented by a storage unit, such as a memory.

In step S140, when the look-up information is ready, a layout data (such as a Gds file) of the chip may be analyzed to obtain a pattern density information. Please be noted here, to detect the pattern density information means to detect a density area of the chip. The pattern density information may include a density of the density area, and a distance between the density area and a specified resistance measuring block in the chip.

In step S150, a calibrated layout data may be obtained according to the pattern density information and the look-up information. In detail, by looking up the look-up information according to the pattern density information obtained in step S140, an optical proximity correction (OPC) selective sizing skill can be performed for controlling the critical dimension (CD) of the chip, and the calibrated layout data may be obtained correspondingly. That is, an updated Gds file may be obtained in step S150.

It should be noted here, the updated Gds file may be used to tape-out, and an updated chip is generated accordingly. That is, a plurality of updated hot spot patterns and updated test keys in the updated chip can be obtained. For compensating the thermal uniformity better, a plurality of third resistances of the updated hot spot patterns of the updated chip over the hot spot effect can be measured, wherein, a plurality of pattern densities of the updated hot spot patterns are different. Moreover, a plurality of fourth resistances of each of the updated hot spot patterns of the updated chip by a plurality of updated test keys over the hot spot effect be measured, wherein a plurality of distances between the updated test keys and the corresponding updated hot spot pattern are different. Furthermore, an updated look-up information can be obtained according to the third and fourth resistances.

Here, the calibrated layout data may be further calibrated once more according to the updated look-up information, and a new layout data with better thermal uniformity can be generated.

Figures 7A, 7B:
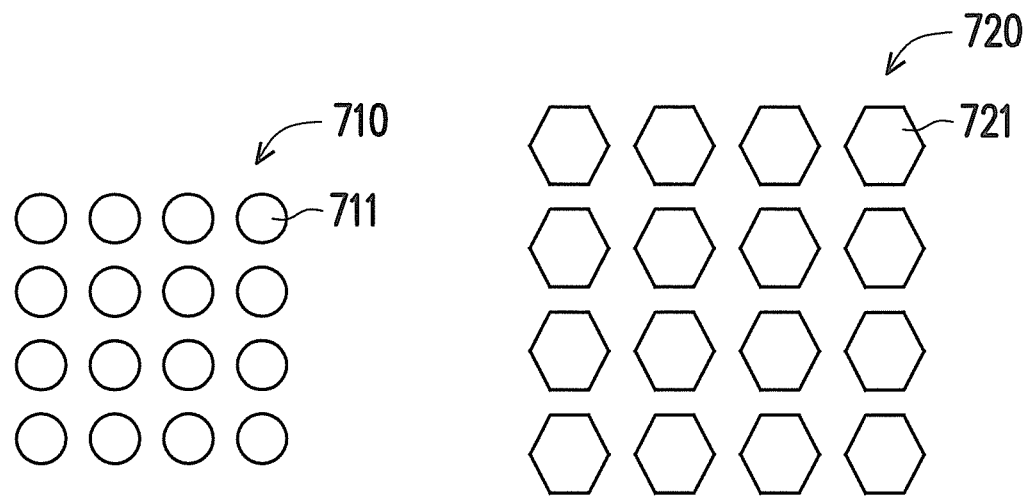
FIG. 7A and FIG. 7B respectively illustrate diagrams of hot spot patterns according to different embodiments of present application.

Referring to FIG. 7A and FIG. 7B, FIG. 7A and FIG. 7B respectively illustrate diagrams of hot spot patterns according to different embodiments of present application. In FIG. 7A, the hot spot pattern 710 is formed by a plurality of resistance providing units 711, and a shape of each of the resistance providing units 711 is circle. Of course, the shape of each of the resistance providing units 711 may be oval. On the other hand, in FIG. 7B, the hot spot pattern 720 is formed by a plurality of resistance providing units 721, and a shape of each of the resistance providing units 721 is a polygon, such as hexagon. Of course, the shape of each of the resistance providing units 721 is not limited to be hexagon, and the shape of each of the resistance providing units 721 may be triangle, rectangle, pentagon or any other polygon.

Figure 8:
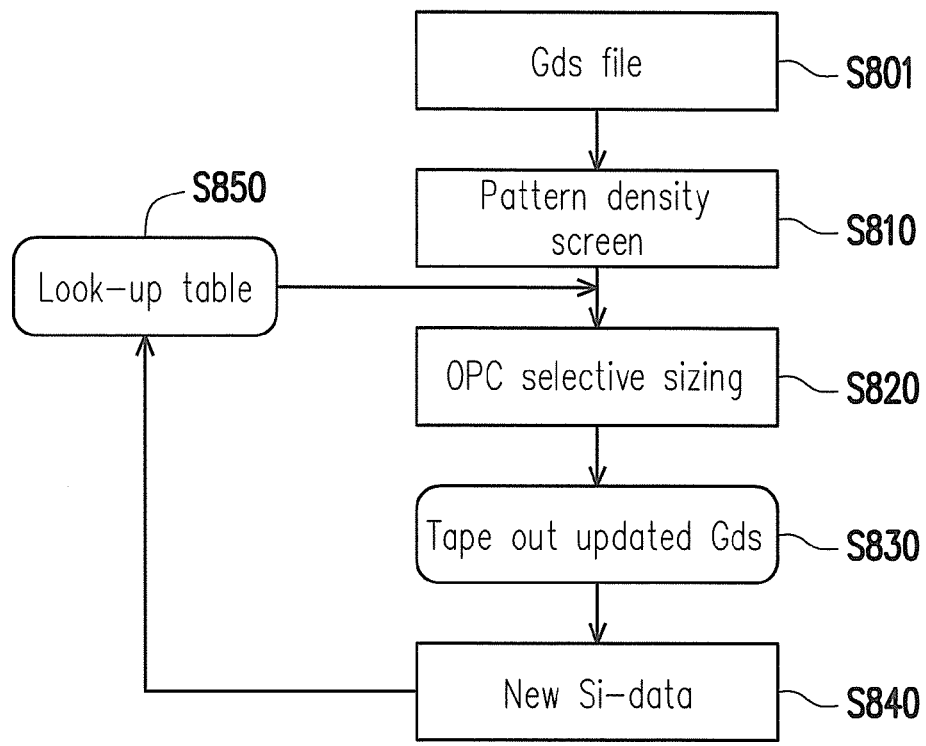
FIG. 8 illustrates a flow chart of a thermal uniformity compensating method for a chip according to another embodiment of present application.
Figure 9:
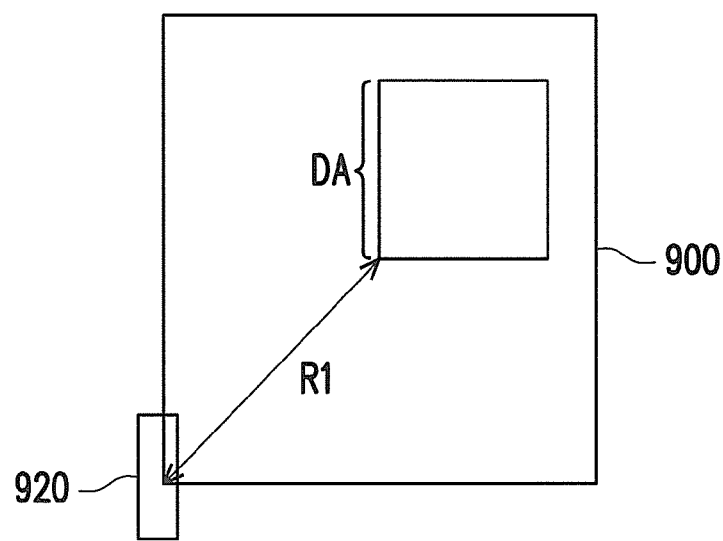
FIG. 9 illustrates a diagram of the chip according to the embodiment of present application.

Referring to FIG. 8, FIG. 8 illustrates a flow chart of a thermal uniformity compensating method for a chip according to another embodiment of present application. In S801, a Gds file of the chip is ready, and the Gds file is provided for analyzing. In step S850, a look-up table is established. The look-up table may be obtained by steps S110-S130 of the embodiment of FIG. 1, and no more detail descriptions here. Moreover, in step S810, a pattern density screen operation is operated on the Gds file for detecting one or more density areas in the chip. Referring to FIG. 9 here, wherein FIG. 9 illustrates a diagram of the chip according to the embodiment of present application. In FIG. 9, a density area DA in the chip 900 may be detected by step S810. In step S820, an OPC selective sizing operation may be operated according to the look-up table and the one or more density areas DA in the chip 900, and an update Gds file can be obtained. Please be noted here, the distance R1 between the density areas DA and the resistance and a resistance sensing element 920 may be considered when the OPC selective sizing operation is operated.

In step S830, an updated chip is obtained by taping out the updated Gds file, and a new Si-data may be obtained in step S840 by measuring parameters of elements of the updated chip. The new Si-data may be provided for updating the look-up table, and the updated look-up table may be provided to be a new data base for OPC selective sizing operation in next then thermal uniformity compensating turn.

Figure 10:
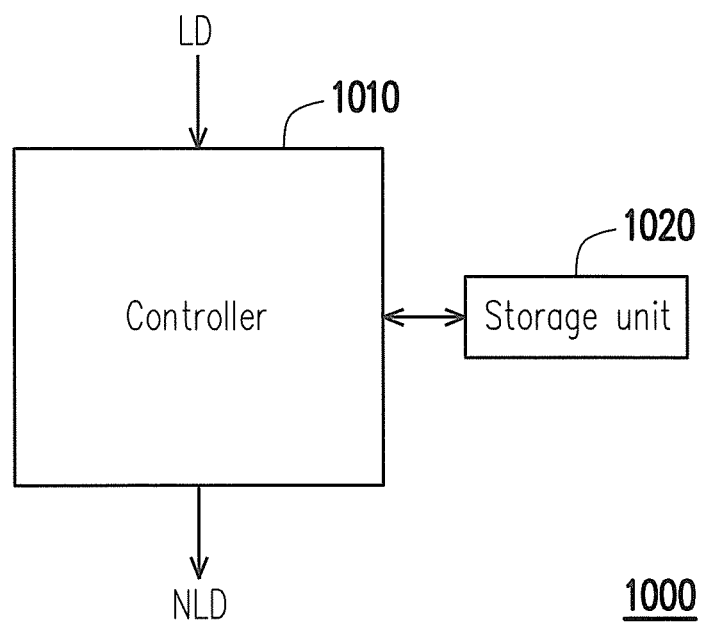
FIG. 10 illustrates a block diagram of a thermal uniformity compensating apparatus according to an embodiment of present application.

Referring to FIG. 10, FIG. 10 illustrates a block diagram of a thermal uniformity compensating apparatus according to an embodiment of present application. In FIG. 10, the thermal uniformity compensating apparatus 1000 includes a controller 1010 and a storage unit 1020. The controller 1010 is coupled to the storage unit 1020. The controller 1010 may receives a layout data LD of a chip, and operates the thermal uniformity compensating operation on the layout data LD to generate a calibrated layout data NLD. The storage unit 1020 is used to store the look-up information. In some embodiment, the storage unit 1020 is a look-up table.

Detail actions of the thermal uniformity compensating operation are described in the embodiments mentioned before, and no more repeated descriptions here.

In summary, present application provides the thermal uniformity compensating method by a look-up information, and the look-up information is obtained by measuring the resistances of the hot spot patterns based on different conditions. Accordingly, critical dimension (CD) can be well controlled by an OPC selective resizing operation based on the look-up information. Furthermore, no complicated procedure needed in the thermal uniformity compensating method of present application, and easy to carry out.

It will be apparent to those skilled in the art that various modifications and variations can be made to the structure of the invention without departing from the scope or spirit of the invention. In view of the foregoing, it is intended that the invention cover modifications and variations of this invention provided they fall within the scope of the following claims and their equivalents.

What is claimed is:

1. A thermal uniformity compensating method for a chip, comprising:
   disposing a plurality of hot spot patterns and test keys in the chip on a semiconductor wafer;
   respectively measuring a plurality of first resistances of the hot spot patterns of the chip by the test keys over a hot spot effect, wherein a plurality of pattern densities of the hot spot patterns are different;
   respectively measuring a plurality of second resistances of each of the hot spot patterns of the chip by the test keys over the hot spot effect, wherein a plurality of distances between the test keys and the corresponding hot spot pattern are different;
   establishing a look-up information according to the first and second resistances, wherein the look-up information is established based on the pattern densities and the distances, and used for looking-up to obtain a plurality of resistance variations;
   analyzing a layout data of the chip for obtaining a pattern density information; and
   generating a calibrated layout data according to the pattern density information and the look-up information.

2. The thermal uniformity compensating method as claimed in claim 1, further comprising:
   generating an updated chip according to the calibrated layout data;
   respectively measuring a plurality of third resistances of a plurality of updated hot spot patterns of the updated chip over the hot spot effect, wherein a plurality of pattern densities of the updated hot spot patterns are different;
   respectively measuring a plurality of fourth resistances of each of the updated hot spot patterns of the updated chip by a plurality of updated test keys over the hot spot effect, wherein a plurality of distances between the updated test keys and the corresponding updated hot spot pattern are different; and
   updating the look-up information to obtain an updated look-up information according to the third and fourth resistances.

3. The thermal uniformity compensating method as claimed in claim 1, wherein each of the hot spot patterns is formed by a plurality of resistance providing units, and the resistance providing units are arranged in an array.

4. The thermal uniformity compensating method as claimed in claim 3, wherein the resistance providing units are poly blocks or diffusion blocks.

5. The thermal uniformity compensating method as claimed in claim 3, wherein a shape of each the resistance providing units is oval, circle or polygon.

6. The thermal uniformity compensating method as claimed in claim 3, wherein a distance between two neighbored resistance providing units of each of the hot spot patterns is inversely proportional to the corresponding pattern densities.

7. The thermal uniformity compensating method as claimed in claim 1, wherein each of the hot spot patterns is coupled to the corresponding test keys, and the first resistance and second resistances corresponding to each of the hot spot patterns are obtained through the corresponding test keys.

8. The thermal uniformity compensating method as claimed in claim 1, wherein the calibrated layout data is generated by an optical proximity correction operation according to the look-up information and the pattern density information.

9. A thermal uniformity compensating apparatus, comprising:
   a chip, disposed on a semiconductor wafer, wherein a plurality of hot spot patterns and test keys are disposed in the chip; and
   a controller being configured for:
     respectively measuring a plurality of first resistances of the hot spot patterns of a chip by the test keys over a hot spot effect; and respectively measuring a plurality of second resistances of each of the hot spot patterns of the chip by the test keys over the hot spot effect, wherein a plurality of pattern densities of the hot spot patterns are different, and a plurality of distances between the test keys and the corresponding hot spot pattern are different;

establishing a look-up information according to the first and second resistances, wherein the look-up information is established based on the pattern densities and the distances, and used for looking-up to obtain a plurality of resistance variations;

analyzing a layout data of the chip for obtaining a pattern density information; and generating a calibrated layout data according to the pattern density information and the look-up information; and a storage unit, coupled to the controller for storing the look-up information.

10. The thermal uniformity compensating apparatus as claimed in claim 9, wherein the controller is further configured for:

providing the calibrated layout data to generate an updated chip;

respectively measuring a plurality of third resistances of a plurality of updated hot spot patterns of the updated chip over the hot spot effect, and respectively measuring a plurality of fourth resistances of each of the updated hot spot patterns of the updated chip by a plurality of test keys over the hot spot effect, wherein a plurality of distances between the test keys and the corresponding updated hot spot pattern are different, wherein, a plurality of pattern densities of the updated hot spot patterns are different and a plurality of distances between the test keys and the corresponding updated hot spot pattern are different; and updating the look-up information to obtain an updated look-up information according to the third and fourth resistances.

11. The thermal uniformity compensating apparatus as claimed in claim 9, wherein each of the hot spot patterns is formed by a plurality of resistance providing units, and the resistance providing units are arranged in an array.

12. The thermal uniformity compensating apparatus as claimed in claim 11, wherein the resistance providing units are poly blocks or diffusion blocks.

13. The thermal uniformity compensating apparatus as claimed in claim 11, wherein a distance between two neighbored resistance providing units of each of the hot spot patterns is inversely proportional to the corresponding pattern densities.

14. The thermal uniformity compensating apparatus as claimed in claim 11, wherein a shape of each the resistance providing units is oval, circle or polygon.

15. The thermal uniformity compensating apparatus as claimed in claim 9, wherein each of the hot spot patterns is coupled to the corresponding test keys, and the first resistance and second resistances corresponding to each of the hot spot patterns are obtained through the corresponding test keys.

16. The thermal uniformity compensating apparatus as claimed in claim 9, wherein the calibrated layout data is generated by an optical proximity correction operation according to the look-up information and the pattern density information.

* * * * *